(12) United States Patent
Wang et al.

(10) Patent No.: US 7,557,555 B2
(45) Date of Patent: Jul. 7, 2009

(54) METHOD TO DETERMINE AN OPERATING CHARACTERISTIC OF A VEHICLE POWER CONVERTER

(75) Inventors: Jin Wang, Northville, MI (US);
Bernard Nefcy, Novi, MI (US);
Chingchi Chen, Ann Arbor, MI (US);
Michael Degner, Novi, MI (US);
Jeffery Scott, Kalamazoo, MI (US);
Lynn McCormick, Grosse Ile, MI (US);
Yuqing Tang, Westland, MI (US);
Hongjie Wu, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 302 days.

(21) Appl. No.: 11/696,909

(22) Filed: Apr. 5, 2007

(65) Prior Publication Data

US 2008/0246508 A1    Oct. 9, 2008

(51) Int. Cl.
*G05F 1/40* (2006.01)
*H02M 1/12* (2006.01)

(52) U.S. Cl. .................. 323/288; 323/259; 323/285; 363/41

(58) Field of Classification Search ............... 323/222, 323/225, 259, 284, 285, 288, 290, 351; 363/39–41
See application file for complete search history.

(56) References Cited

U.S. PATENT DOCUMENTS

| | | | |
|---|---|---|---|
| 5,343,125 A * | 8/1994 | Bernitz et al. | 315/245 |
| 5,654,621 A * | 8/1997 | Seelig | 320/108 |
| 6,297,621 B1 | 10/2001 | Hui et al. | |
| 6,590,400 B2 * | 7/2003 | Hilliard et al. | 324/654 |
| 7,019,506 B2 | 3/2006 | Kernahan | |
| 7,352,598 B2 * | 4/2008 | Hirono et al. | 363/41 |
| 2006/0145675 A1 | 7/2006 | Lee et al. | |

OTHER PUBLICATIONS

Toshiya Ohnuki, et al., Control of a Three-Phase PWM Rectifier Using Estimated AC-Side and DC-Side Voltages, IEEE Transactions On Power Electronics, Mar. 1999, pp. 222-226, vol. 14, No. 2.

* cited by examiner

*Primary Examiner*—Jessica Han
(74) *Attorney, Agent, or Firm*—David B. Kelley; Brooks Kushman P.C.

(57) ABSTRACT

Measured or otherwise known operating characteristics of a DC/DC power converter are used to determine, without measuring, an operating characteristic of the DC/DC power converter.

15 Claims, 4 Drawing Sheets

METHOD TO DETERMINE AN OPERATING CHARACTERISTIC OF A VEHICLE POWER CONVERTER

BACKGROUND OF THE INVENTION

1. Field of the Invention

The invention relates to methods to determine operating characteristics of vehicle power converters.

2. Discussion

In alternatively powered vehicles, a DC/DC converter may be used to boost DC voltage from a high voltage battery pack to a desired value for traction inverters.

The battery voltage and boost voltage of such a converter may be sensed using duplicate voltage sensing circuits.

SUMMARY

Embodiments of the invention may take the form of a method for determining an operating characteristic of a DC/DC power converter for an automotive vehicle. The method includes determining a duty cycle of the DC/DC power converter, measuring one of first and second voltages, and determining the other of the first and second voltages based on the duty cycle and the one of the first and second voltages.

Embodiments of the invention may take the form of a method for determining an operating characteristic of a DC/DC power converter for an automotive vehicle. The method includes determining at least one of an on time and an off time of the DC/DC power converter, measuring all but one of a first voltage, a second voltage, and a ripple of a current thereby identifying measured operating characteristics, and determining the other of the first voltage, the second voltage, and the ripple of the current based on one of the on time and off time, and the measured operating characteristics.

While exemplary embodiments in accordance with the invention are illustrated and disclosed, such disclosure should not be construed to limit the claims. It is anticipated that various modifications and alternative designs may be made without departing from the scope of the invention.

DETAILED DESCRIPTION

Duplicate voltage sensing circuits may increase the cost and size of a control circuit for a power converter. Also, because some voltage sensing circuits need high and low voltage isolation, additional sensing circuits may lower the total impedance between any high and low voltage systems.

Figure 1:
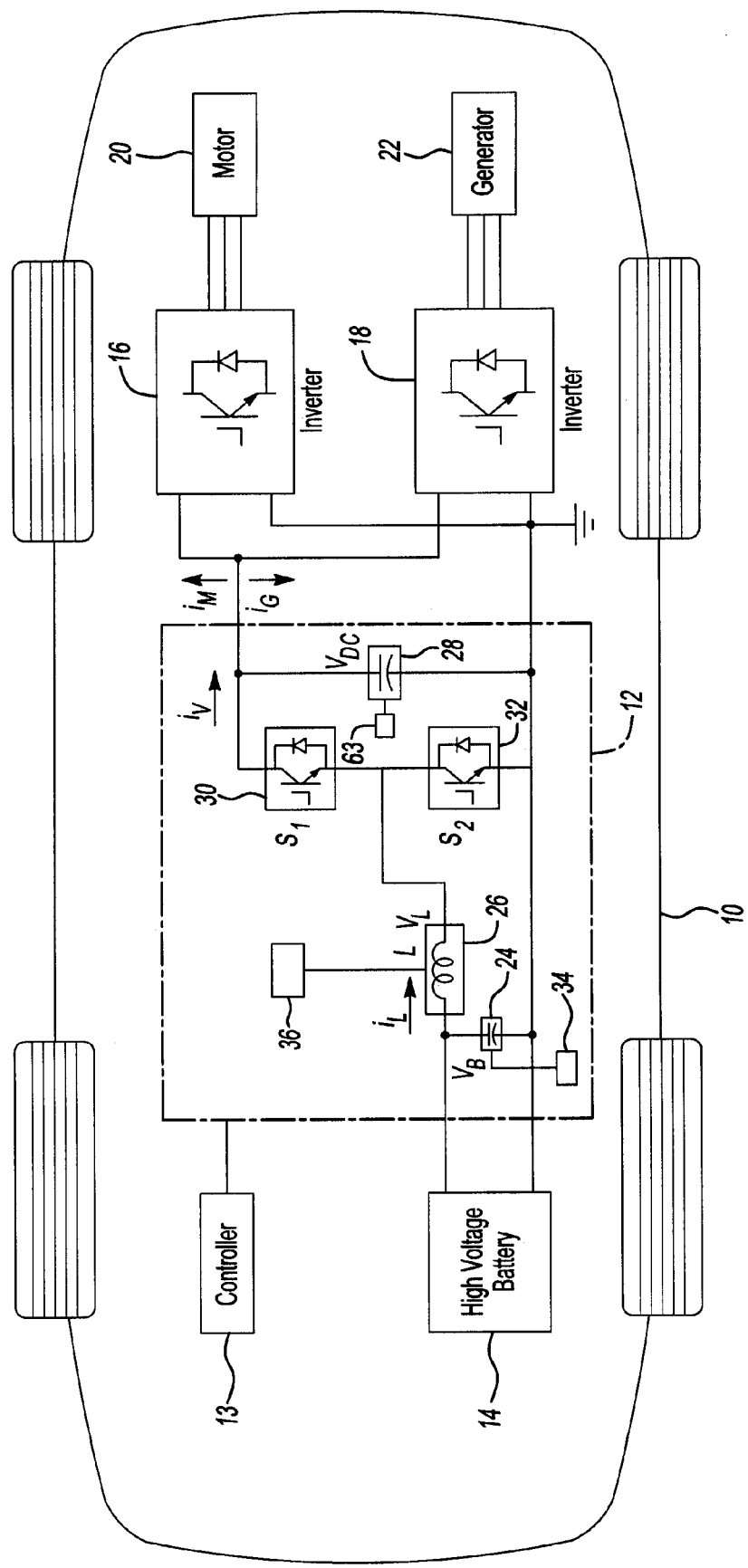
FIG. 1 is a block diagram of a power system for an alternatively powered vehicle in accordance with an embodiment of the invention and shows a converter electrically connected with a controller, a high voltage battery, and two inverters.

FIG. 1 is a block diagram of a power system for vehicle 10. Power converter 12 is electrically connected with controller 13, high voltage battery 14, and inverters 16, 18. Inverter 16 is electrically connected with motor 20 and inverter 18 is electrically connected with generator 22.

Power converter 12 includes capacitor 24 electrically connected with high voltage battery 14, inductor 26 electrically connected with high voltage battery 14, and capacitor 28 electrically connected with inverters 16, 18. Controller 13 selectively operates switches 30, 32, e.g., field effect power transistors, to achieve desired power conversion. For example, when power converter 12 acts as a boost converter, switch 30 is off and switch 32 is selectively switched on and off at predetermined time intervals. When switch 32 is off, during $t_{off}$, current $i_L$ flows through the diode of switch 30. When switch 32 is on, during $t_{on}$, current $i_L$ flows through switch 32.

Circuit 34, e.g., voltage sensor, measures the voltage across capacitor 24. Circuit 36, e.g., current sensor, measures the current $i_L$ through inductor 26. This information is communicated to controller 13. As described below, the voltage across capacitor 28, e.g., $V_{DC}$, will be determined based on the voltage across capacitor 24 and the on/off times of switch 32. As such, a circuit, e.g., voltage sensor, to measure the voltage across capacitor 28 is not necessary. In alternative embodiments, circuit 34, circuit 36, and/or circuit 63 may be omitted if the methods herein are employed.

Figure 2:
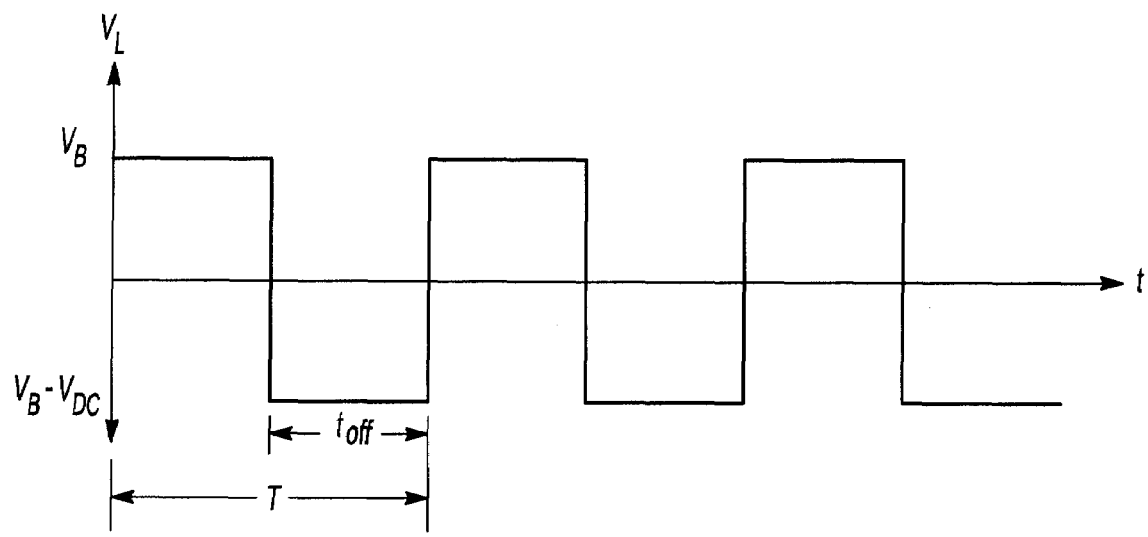
FIG. 2 is a voltage wave form and shows the voltage across an inductor of the converter of FIG. 1 during a period of time.

FIG. 2 is a wave form of the voltage $V_L$ over time t. This wave form has a period T. When switch 32 is off, during $t_{off}$, $V_L$ is equal to the voltage across capacitor 24, e.g., $V_B$, minus the voltage across capacitor 28, e.g., $V_{DC}$. When switch 32 is on, during T−$t_{off}$ (or $t_{on}$), $V_L$ is equal to the voltage across capacitor 24, e.g., $V_B$. Controller 13 thus operates switch 32 such that it achieves the desired T, $t_{off}$, and $t_{on}$ times.

The area under the rectangle defined by ($V_B$−$V_{DC}$) and $t_{off}$ is equal to the area under the rectangle defined by $V_B$ and $t_{on}$. Or, put another way $$V_{DC} = \frac{V_B \cdot T}{t_{off}}. \qquad (1)$$

If all but one of the variables of (1) are known or given, the unknown variable can be determined without measuring that variable.

Figure 3:
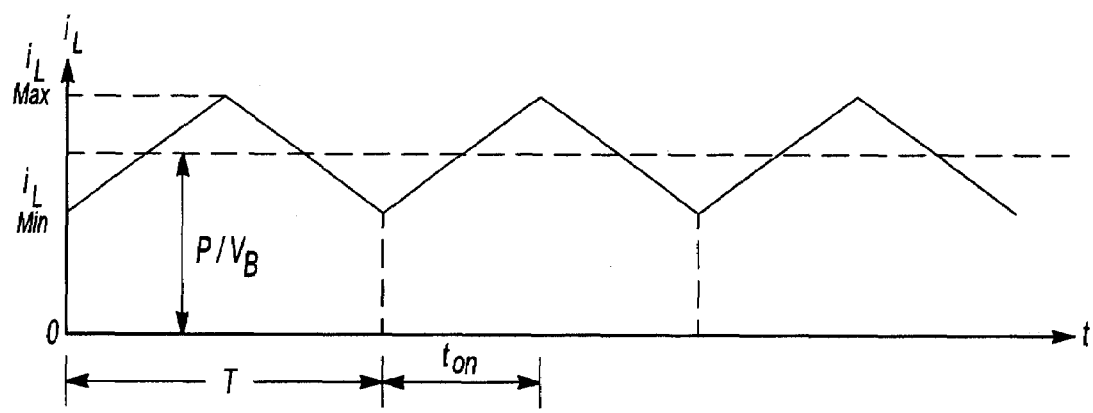
FIG. 3 is a current wave form and shows the current through an inductor of the converter of FIG. 1 during a period of time.

FIG. 3 is a wave form of the current $i_L$ over time t. For voltage control of power converter 12, circuit 36 may be used to sense current $i_L$. This current is a result of the voltage difference between $V_B$ and $V_{DC}$, the conducting time of switches 30, 32, and the inductance L of inductor 26. P is the power from high voltage battery 14.

Referring to FIGS. 2 and 3, the voltage $V_L$ is given by $$L \cdot \frac{di_L}{dt} = V_L.$$

Or, put another way $$L \cdot (i_{LMAX} - i_{LMIN}) = -(V_B - V_{DC}) \cdot t_{off} \quad (2)$$

$$i_{LMAX} - i_{LMIN} = \frac{(V_{DC} - V_B) \cdot t_{off}}{L}.$$

If all but one of the variables of (2) are known or given, the unknown variable can be determined without measuring that variable.

Figure 4A:
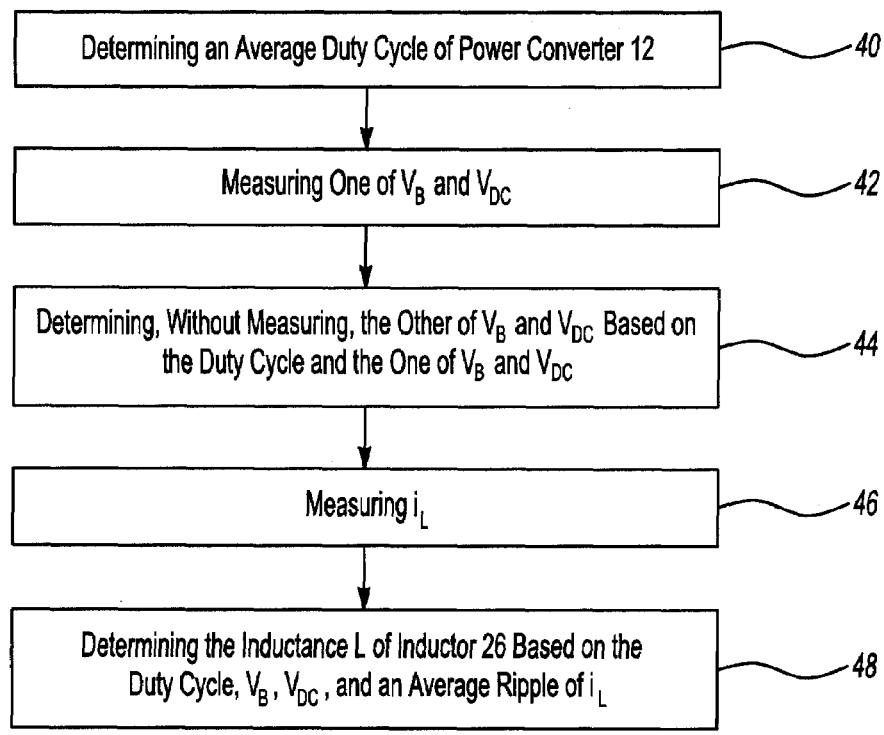
FIG. 4A is a flow chart of a method for determining, without measuring, an operating characteristic of the converter of FIG. 1 in accordance with an embodiment of the invention.

FIG. 4A is a flow chart of a method for determining, without measuring, an operating characteristic of power converter 12. At 40, controller 13 determines an average duty cycle of power converter 12. At 42, circuit 34 measures $V_B$. At 44, with $V_B$, T, and $t_{off}$ known or measured, controller 13 determines $V_{DC}$ using (1). At 46, circuit 36 measures $i_L$. At 48, with $i_{LMAX}$, $i_{LMIN}$, $V_B$, $V_{DC}$, and $t_{off}$ known or measured, controller 13 determines the inductance L of inductor 26 using (2).

Figure 4B:
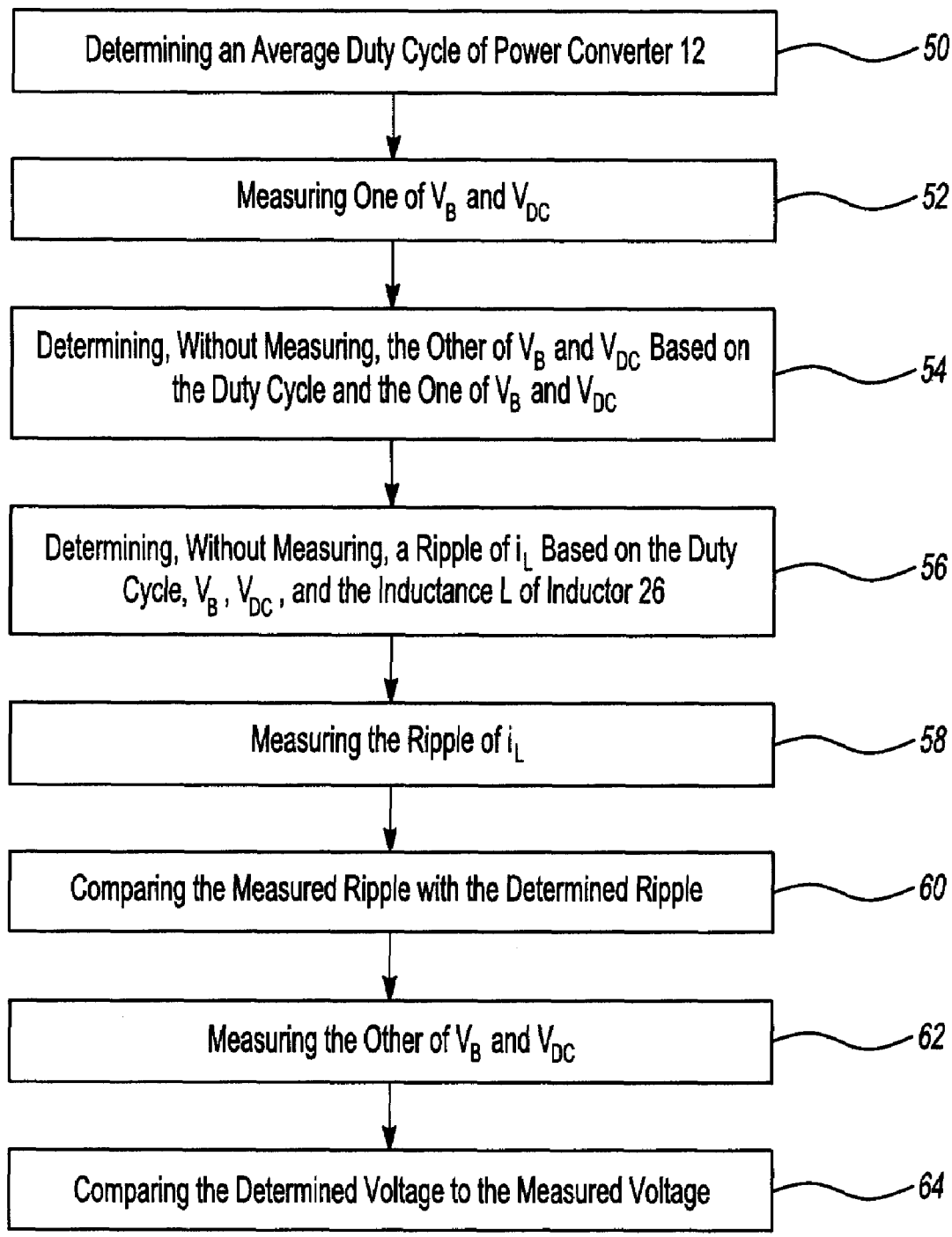
FIG. 4B is another flow chart of a method for determining, without measuring, an operating characteristic of the converter of FIG. 1 in accordance with an embodiment of the invention.

FIG. 4B is another flow chart of a method for determining, without measuring, an operating characteristic of power converter 12. At 50, controller 13 determines an average duty cycle of power converter 12. At 52, circuit 34 measures $V_B$. At 54, with $V_B$, T, and $t_{off}$ known or measured, controller 13 determines $V_{DC}$ using (1). At 56, controller 13 determines a ripple of $i_L$ based on $V_B$, $V_{DC}$, $t_{off}$, and L using (2). At 58, circuit 36 measures $i_L$. At 60, controller 13 compares the measured ripple of $i_L$ from step 58 with the determined ripple of $i_L$ from step 56. At 62, circuit 63, e.g., voltage sensor, measures $V_{DC}$. At 64, controller 13 compares the measured $V_{DC}$ from step 62 with the determined $V_{DC}$ from step 54.

Figure 5:
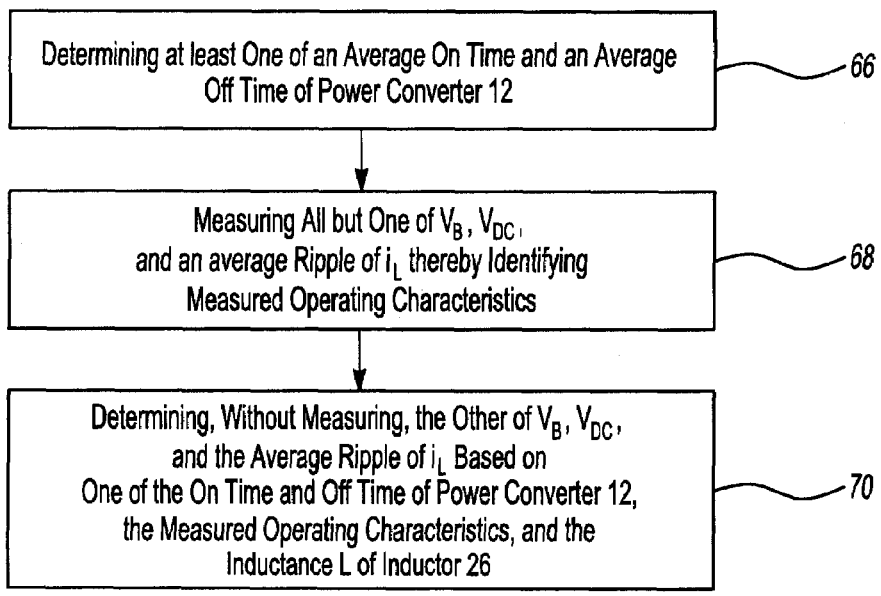
FIG. 5 is still another flow chart of a method for determining, without measuring, an operating characteristic of the converter of FIG. 1 in accordance with an embodiment of the invention.

FIG. 5 is another flow chart of a method for determining, without measuring, an operating characteristic of power converter 12. At 66, at least one of an average on time and average off time of power converter 12 is determined. At 68, all but one of $V_B$, $V_{DC}$, and an average ripple of $i_L$ are measured. At 70, the other of $V_B$, $V_{DC}$, and an average ripple of $i_L$ is determined without being measured using (2).

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed:

1. A method for determining, without measuring, an operating characteristic of a DC/DC power converter for an automotive vehicle including a power storage unit and a bus wherein the DC/DC power converter has a storage side electrically connected with the power storage unit and a bus side electrically connected with the bus and wherein the DC/DC power converter includes a first capacitor, having a first voltage, electrically connected with the storage side and a second capacitor, having a second voltage, electrically connected with the bus side, the method comprising:
   determining a duty cycle of the DC/DC power converter;
   measuring one of the first and second voltages; and
   determining, without measuring, the other of the first and second voltages based on the duty cycle and the one of the first and second voltages thereby determining the operating characteristic of the DC/DC power converter.

2. The method of claim 1 wherein the DC/DC power converter further includes an inductor electrically connected with the storage side, wherein a current flows through the inductor, and wherein the method further comprises measuring the current.

3. The method of claim 2, wherein the inductor has an inductance, further comprising determining the inductance based on the duty cycle, the first and second voltages, and a ripple of the current.

4. The method of claim 3 wherein the ripple is an average ripple.

5. The method of claim 1 wherein the DC/DC power converter further includes an inductor, having an inductance, electrically connected with the storage side and wherein a current flows through the inductor, further comprising determining, without measuring, a ripple of the current based on the duty cycle, the first and second voltages, and the inductance.

6. The method of claim 5 further comprising measuring the ripple and comparing the measured ripple with the determined ripple.

7. The method of claim 1 further comprising, after the step of determining, without measuring, the other of the first and second voltages, measuring the other of the first and second voltages and comparing the determined voltage to the measured voltage.

8. The method of claim 1 wherein the duty cycle is an average duty cycle.

9. A method for determining, without measuring, an operating characteristic of a DC/DC power converter for an automotive vehicle including a power storage unit and a bus, wherein the DC/DC power converter has a storage side electrically connected with the power storage unit and a bus side electrically connected with the bus, wherein the DC/DC power converter includes a first capacitor, having a first voltage, electrically connected with the storage side, a second capacitor, having a second voltage, electrically connected with the bus side, and an inductor, having an inductance, electrically connected with the storage side, and wherein a current flows through the inductor, the method comprising:
   determining at least one of an on time and an off time of the DC/DC power converter;
   measuring all but one of the first voltage, the second voltage, and a ripple of the current thereby identifying measured operating characteristics; and
   determining, without measuring, the other of the first voltage, the second voltage, and the ripple of the current based on one of the on time and off time, the measured operating characteristics, and the inductance thereby determining the operating characteristic of the DC/DC power converter.

10. The method of claim 9 wherein the first voltage and second voltage comprise the measured operating characteristics.

11. The method of claim 9 wherein the second voltage and ripple comprise the measured operating characteristics.

12. The method of claim 9 wherein the first voltage and ripple comprise the measured operating characteristics.

13. The method of claim 9 wherein the on time is an average on time.

14. The method of claim 9 wherein the off time is an average off time.

15. The method of claim 9 wherein the ripple is an average ripple.

* * * * *